(12) United States Patent
Rietzler et al.

(10) Patent No.: US 8,665,172 B2
(45) Date of Patent: Mar. 4, 2014

(54) CHIP CARRIER FOR A TRANSPONDER MODULE AND TRANSPONDER MODULE

(75) Inventors: Manfred Rietzler, Marktoberdorf (DE); Raymond Freeman, Mesa, AZ (US)

(73) Assignee: Smartrac IP B.V. (NL)

( * ) Notice: Subject to any disclaimer, the term of this patent is extended or adjusted under 35 U.S.C. 154(b) by 467 days.

(21) Appl. No.: 12/921,700

(22) PCT Filed: Mar. 20, 2009

(86) PCT No.: PCT/EP2009/002088
§ 371 (c)(1),
(2), (4) Date: Sep. 9, 2010

(87) PCT Pub. No.: WO2009/118136
PCT Pub. Date: Oct. 1, 2009

(65) Prior Publication Data
US 2011/0006967 A1    Jan. 13, 2011

(30) Foreign Application Priority Data
Mar. 28, 2008  (DE) .......................... 10 2008 016 274

(51) Int. Cl.
*H01Q 21/00*  (2006.01)
(52) U.S. Cl.
USPC ........... 343/867; 343/866; 343/741; 343/788; 343/904; 340/572.7
(58) Field of Classification Search
USPC ........ 343/866, 867, 741, 788, 904; 340/572.7
See application file for complete search history.

(56) References Cited

U.S. PATENT DOCUMENTS

| | | | |
|---|---|---|---|
| 6,666,380 B1 * | 12/2003 | Suzuya | 235/492 |
| 7,100,836 B2 | 9/2006 | Puschner et al. | |
| 7,404,522 B2 | 7/2008 | Kawai | |
| 7,451,936 B2 | 11/2008 | Puschner et al. | |
| 2004/0188531 A1 * | 9/2004 | Gengel et al. | 235/491 |
| 2006/0243812 A1 | 11/2006 | Puschner et al. | |
| 2008/0315992 A1 * | 12/2008 | Forster | 340/10.1 |

FOREIGN PATENT DOCUMENTS

| | | |
|---|---|---|
| CN | 1624718 A | 6/2005 |
| CN | 1795456 A | 6/2006 |
| DE | 196 40 304 A1 | 4/1998 |
| DE | 197 03 990 A1 | 8/1998 |
| DE | 197 45 648 A1 | 11/1998 |

(Continued)

OTHER PUBLICATIONS

State Intellectual Property Office of People's Republic of China, First Office Action, Application No. 200980110279.6, Jun. 11, 2012.

(Continued)

*Primary Examiner* — Dieu H Duong
(74) *Attorney, Agent, or Firm* — Quarles & Brady LLP

(57) ABSTRACT

A chip carrier for contacting with a chip and an antenna is disposed on an antenna substrate. The chip carrier features a carrier substrate having a chip contact arrangement located at a distance from longitudinal ends of the carrier substrate for electrical contacting with a chip. The carrier substrate includes two antenna contact surfaces having the chip contact arrangement therebetween for electrical contacting with the antenna. The chip contact arrangement and the antenna contact surfaces are located on an application surface of the chip carrier. At least one insulation surface-is formed on the application surface between the chip contact arrangement and the antenna contact surfaces.

5 Claims, 3 Drawing Sheets

(56) References Cited

FOREIGN PATENT DOCUMENTS

| | | |
|---|---|---|
| DE | 199 12 201 C2 | 8/2000 |
| DE | 100 52 517 A1 | 10/2000 |
| DE | 199 20 593 A1 | 11/2000 |
| DE | 199 58 328 A1 | 7/2001 |
| DE | 100 58 804 A1 | 6/2002 |
| DE | 102 49 198 A1 | 5/2004 |
| EP | 1 628 244 A | 2/2006 |
| JP | 2003006602 A * | 1/2003 |
| WO | 2004/044834 A1 | 5/2004 |

OTHER PUBLICATIONS

The International Search Report under date of Jul. 13, 2009 in connection with PCT/EP2009/002088.

Translation of the International Preliminary Report on Patentability, Application No. PCT/EP2009/002088, Oct. 14, 2010.

* cited by examiner

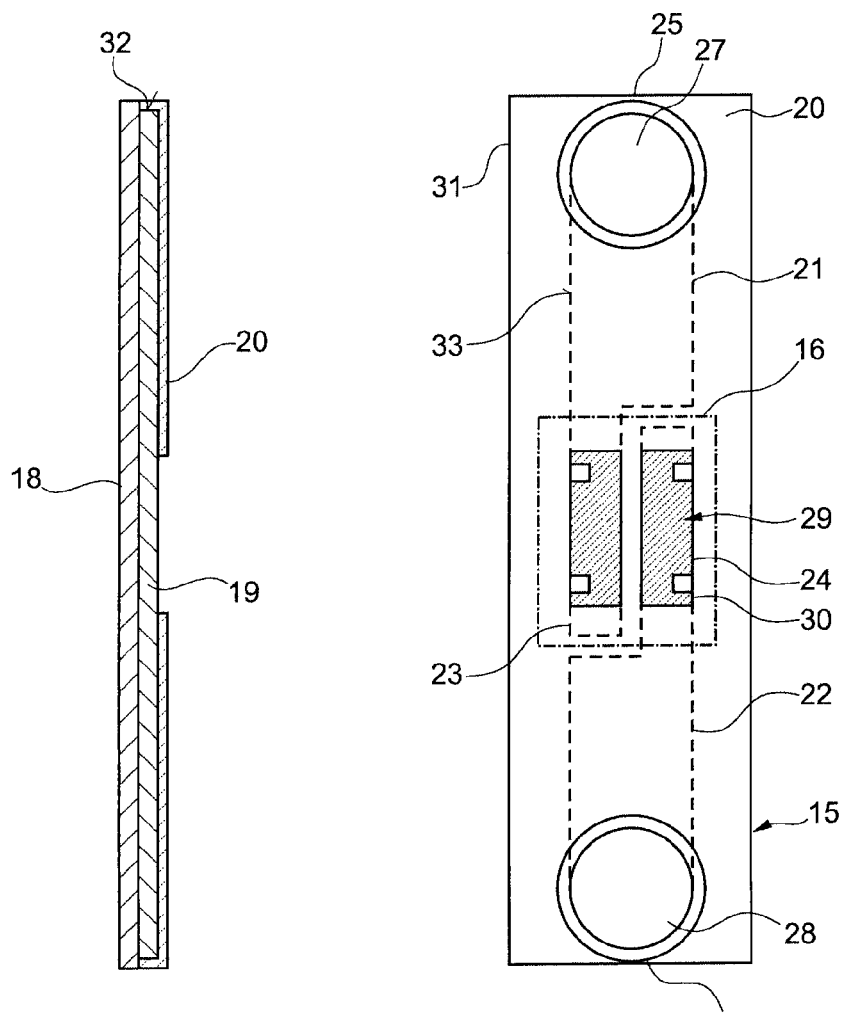
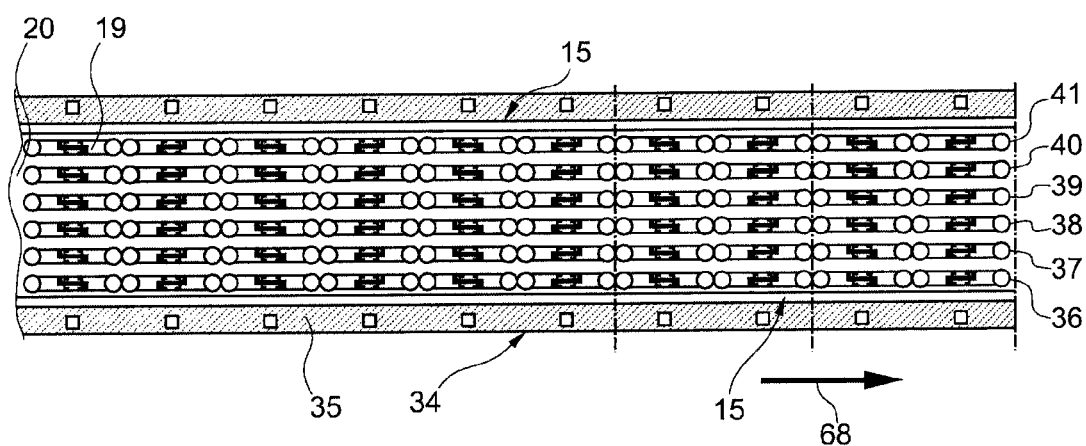
Fig. 3      Fig. 2
Fig. 4

CHIP CARRIER FOR A TRANSPONDER MODULE AND TRANSPONDER MODULE

CROSS-REFERENCE TO RELATED APPLICATIONS

This application claims priority to PCT International Application No. PCT/EP2009/002088 filed on Mar. 20, 2009, which claims the benefit of German Patent Application No. 10 2008 016 274.4 filed Mar. 28, 2008, both of which are incorporated herein by reference.

STATEMENT REGARDING FEDERALLY SPONSORED RESEARCH OR DEVELOPMENT

Not applicable.

FIELD OF THE INVENTION

The present invention relates to a chip carrier for contacting with a chip and an antenna disposed on an antenna substrate. Moreover, the present invention also relates to a chip carrier arrangement comprising a plurality of chip carriers which are disposed on a film-like sheet carrier. In addition, the present invention relates to a chip module comprising a chip carrier and a transponder module comprising a chip module disposed on an antenna module using a chip carrier. Finally, the present invention also relates to an antenna module for producing such a transponder module.

BACKGROUND OF THE INVENTION

Transponder modules which feature an antenna module and a chip module contacted with the antenna module are sufficiently known and are employed in various embodiments for recognition or authentication purposes. In a frequently encountered embodiment, transponder modules feature an antenna module which is equipped with an antenna mounted on an antenna substrate and forming several windings on the antenna substrate and is connected to the chip module via contact surfaces provided at the winding ends. Such transponder modules enable contactless access to the chip via the antenna, such that for instance identification data stored on the chip can be read with the aid of a suitable reading device.

If such transponder modules are utilized for the production of adhesive labels or luggage labels or the like, such a transponder module, on both sides thereof, is provided with cover layers which, where appropriate, serve as a carrier surface for the application of an adhesive bonding material or printing. In spite of this regularly very thinly configured layer structure, it goes without saying that it is necessary to ensure that the chip which is highly sensitive to mechanical stresses is sufficiently protected. For this purpose, it is known to provide the chip with a suitable housing. However, it is a drawback of this housing that it gives rise to the formation of a local thickening quickly emerging from the outer surface. As a consequence, subsequent printing of the layer structure of the transponder module is rendered more difficult and the formation of an adhesive bonding connection which ensures uniform adhesion over the entire surface is impaired.

SUMMARY OF THE INVENTION

Thus, it is an object of the present invention to realize a transponder module which enables a secure arrangement of the chip in the transponder module, providing protection against mechanical stresses with a minimal impact on the increase of thickness of a layer structure of the transponder module comprising an antenna substrate and a chip substrate.

The inventive chip carrier features a strip-shaped carrier substrate which is provided with a chip contact arrangement located at a distance from longitudinal ends of the carrier substrate for electrical contacting with a chip and which is provided with two antenna contact surfaces having the chip contact arrangement therebetween for electrical contacting with the antenna. In addition, in the inventive chip carrier at least one insulation surface is formed between the chip contact arrangement and the antenna contact arrangements. In the inventive chip carrier, the chip contact arrangement, the antenna contact surfaces and the insulation surface are disposed on the same application surface.

Since the chip contact arrangement is disposed on the same surface as the antenna contact surfaces, the inventive chip carrier makes it possible for the chip to be located in a protected arrangement between the antenna substrate and the chip carrier, respectively the carrier substrate of the chip carrier as a result of contacting the antenna contact surfaces with contact surfaces of an antenna disposed on the antenna substrate. Arranged in such an intermediately received position, the carrier substrate and the antenna substrate substantially form a housing for the chip, such that the formation of a housing in the known manner can be dispensed with. Due to the insulation surface, the chip carrier can be guided directly, i.e. by forming a contact, across antenna windings disposed on the antenna substrate between contact surfaces of the antenna.

According to an advantageous embodiment, the application surface is at least partially furnished with an electrically non-conductive adhesive material, such that the electrically non-conductive adhesive material facilitates the formation of a mechanically resistant connection between the carrier substrate and the antenna substrate likewise on the outside of the contact surfaces.

If, according to a preferred embodiment of the chip carrier, the insulation surfaces are formed by the adhesive material, a fixed mechanical connection between the chip carrier and the antenna substrate is enabled also in the region of the antenna windings.

It is particularly advantageous if the adhesive material is applied along an outer edge of the carrier substrate at least in sections, since thus, besides a fixed mechanical connection, at least the sections furnished with the adhesive material can also be sealed.

A substantially hermetical sealing of the chip can be attained if the adhesive material is applied over the entire surface along the outer edge of the carrier substrate. Moreover, it is advantageous if the antenna contact surfaces of the chip carrier feature aluminum or an alloy containing aluminum, in order to be able to effectively perform the electrical contacting of the chip module with the antenna module according to the ultrasonic bonding process, in particular when forming the antenna or at least the contact surfaces of the antenna of aluminum or of an alloy containing aluminum.

If the carrier substrate of the chip carrier is made of a polyolefin, in particular PET, a particularly good snug fit of the carrier substrate against the antenna substrate is enabled, which enhances reduction of the total thickness of the structure and formation of a sealing arrangement of the carrier substrate on the antenna substrate.

In the inventive chip carrier arrangement, a plurality of chip carriers are disposed on a film-like sheet carrier, such that the chip carriers are arranged in at least one row extending in the longitudinal direction of the sheet carrier, the individual chip carriers extending in the longitudinal direction of the sheet carrier.

The inventive chip carrier arrangement, in an automated manufacturing process for the production of a transponder module, by means of the longitudinal arrangement of the chip carrier on the sheet carrier, enables continuous supply of chip carriers disposed in a row for assembly or contacting with chips and subsequent connection of the thus produced chip modules with the antenna substrate involving minimal handling complexity. In particular, by means of the longitudinal arrangement of the chip carriers, respectively the chip modules, separation of individual chip carriers, respectively chip modules, from the row can be performed involving minimal complexity, i.e. for instance minimal cut length.

If several rows arranged in parallel to one another in the transversal direction of the sheet carrier are provided, it is possible to separate the rows by means of a simple cutting process in the conveying direction of the sheet carrier, in order to be subsequently able to perform in parallel assembly or contacting of antenna substrates which are located in a corresponding row, starting from a sheet carrier.

In the inventive transponder module, an antenna is disposed on the antenna substrate, such that contact surfaces of the antenna are formed at inner and outer contact windings being opposed to one another, at least one winding of the antenna extending therebetween. The contact surfaces of the antenna are contacted with antenna contact surfaces of the chip module, such that the chip on the one hand is received between windings of the antenna and on the other hand is received between the carrier substrate and the antenna substrate.

In this first alternative of the inventive transponder module, the chip module is consequently located on the same surface of the antenna substrate as the antenna.

In an inventive alternative, the contact surfaces of the antenna disposed on the antenna substrate at least partially extend over contact recesses formed in the antenna substrate. In the inventive alternative, the chip module is disposed on the opposite side of the antenna facing the antenna side, such that the antenna contact surfaces are contacted with the contact surface back sides of the antenna in an electrically conductive manner.

This inventive alternative permits contacting between the contact surfaces of the antenna and the antenna contact arrangements of the chip module without requiring contact surfaces to be formed on the opposite side of the antenna substrate.

A particularly secure arrangement for the chip can thus be realized if the chip of the chip module is disposed on the surface of the opposite side. Hence, the chip is disposed between the chip carrier of the chip module and the antenna substrate.

A particularly thin formation of the transponder module is enabled if the chip engages with a chip recess formed in the antenna substrate.

In another alternative of the transponder module, the recess in the antenna substrate can also be formed as a chip module recess, wherein the chip recess and the contact recesses are coherently formed and receive the entire chip module.

It is particularly advantageous if, in the transponder module, the outer edge of the module substrate is sealingly connected to the surface of the at least one winding and/or the surface of the antenna substrate with the aid of the adhesive material applied at least in sections, in order to enable a particularly resistant mechanical connection between the chip module and the antenna substrate, respectively the antenna module.

It is equally advantageous if both the antenna substrate and the carrier substrate are composed of a polyolefin, since thus on the one hand a particularly good snug fit between the carrier substrate and the antenna substrate can be realized and on the other hand, due to the material selection, a lamination for attaining a particularly firmly connected overall configuration of the transponder module is easily implementable.

In this connection, it also proves to be advantageous if the antenna substrate and the carrier substrate of the chip module are composed of the same material, for instance PET.

In the inventive antenna module, the antenna is formed by means of a surface application process, wherein an antenna material is applied to the antenna side of the antenna substrate. According to the invention, the contact surfaces of the antenna, which serve for contacting with the outer contact arrangements of the chip module, in this process extend over recesses formed in the antenna substrate prior to the formation of the antenna.

Hence, as a result of the inventive antenna module, the formation of through-connections for contacting a chip module with the antenna, which is disposed on the opposite side facing the antenna side, is rendered superfluous. By the same token, it is not necessary to form contact surfaces on the opposite side in analogy with the formation of the antenna on the antenna side in a surface application process. Instead, in the inventive antenna module, the contact surfaces are formed by performing the surface application process for forming the antenna on the antenna side of the antenna substrate across the recesses formed in the antenna substrate. As a consequence, contact surfaces are created in the region of the recesses without the formation thereof involving considerable complexity.

BRIEF DESCRIPTION OF THE DRAWINGS

Preferred embodiments of the inventive subject-matters will be described hereinafter in more detail with reference to the drawings.

In the drawings:

FIG. 2 shows a chip module comprising a chip disposed on a chip carrier in a plan view;

FIG. 3 shows the chip module illustrated in FIG. 2 in a lateral view;

FIG. 4 shows a sheet carrier comprising a plurality of chip carriers disposed in longitudinal rows;

DETAILED DESCRIPTION OF THE EXAMPLE EMBODIMENTS

Figure 1:
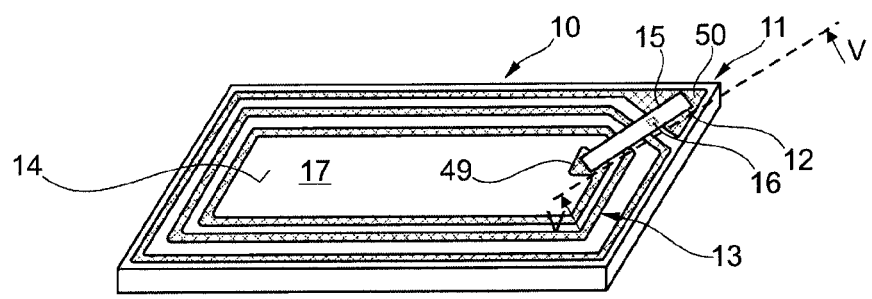
FIG. 1 shows a transponder module comprising a chip module disposed on an antenna module.

FIG. 1 shows a transponder module 10 comprising an antenna module 11 and a chip module 12. In the transponder module 10 shown in FIG. 1, the chip module 12 is located on the antenna side 14 of the antenna module which is equipped with an antenna 13, wherein a chip 16 disposed on a chip carrier 15 of the chip module 12 is received between the chip carrier 15 and an antenna substrate 17 of the antenna module 11.

FIG. 2 shows the chip module 12 in a plan view, wherein for the purpose of better representation of the chip carrier 15, only the contours of the chip 16 are indicated.

As can be seen from a combined view of FIGS. 2 and 3, the chip carrier 15 is substantially configured as a three-layered structure comprising a carrier substrate 18 which, in the present case, is formed of PET, a contact metallization 19 applied to the carrier substrate 18 and here preferably composed of aluminum, and an insulation layer 20 which is disposed on the contact metallization 19.

As can be seen in particular from FIG. 2, the contact metallization 19 is configured as a two-part structure comprising a first contact metallization partial surface 21 and a second contact metallization partial surface 22, each having a contact surface bracket 23 and 24. In the region of the contact surface brackets 23, 24 extending in parallel to one another, and at longitudinal ends 25, 26 of the carrier substrate 18, the insulation layer 20 features contact recesses, each forming an antenna contact surface 27 and 28 at the longitudinal ends 25, 26 and forming a chip contact arrangement 29 in the region of the contact surface brackets 23, 24.

As is evident from the representation of the chip contact arrangement 29 in FIG. 2, in the exemplary embodiment illustrated, it is equipped with protruding contact points, i.e. so-called "bumps" 30 which enable contacting with the chip 16 (only schematically illustrated here) in a so-called "flip chip process".

As can be further seen from a combined view of FIGS. 2 and 3, the contact metallization 19, which like the carrier substrate 18 is configured as a strip, features smaller overall surface dimensions compared to an application surface 31 of the carrier substrate 18, with the result that the insulation layer 20, except for the antenna contact surfaces 27, 28 and the chip contact arrangement 29, does not only cover the contact metallization 19, but longitudinal and transversal edges 32, 33 of the application surface 31 are also covered by means of the adhesive insulation layer 20. On the one hand, a fully insulating covering of the contact metallization 19 is thus realized, except for the chip contact arrangement 29 and the antenna contact surfaces 27, 28. On the other hand, full enclosure of the chip carrier 15 with adhesive material is realized.

In the exemplary embodiment illustrated in FIGS. 2 and 3 of the chip carrier 15, the insulation layer 20 is formed by an application layer made of an adhesive material, such that the insulation layer 20, in the present case, fulfils a double function, in such a manner that in addition to the insulating effect, as a result of the application of the chip carrier 15, respectively the chip module 12 being equipped with the chip carrier 15, on the antenna module 11, corresponding to the representation of FIG. 1, a mechanically resistant adhesively bonded connection with the antenna substrate 17, respectively the antenna 13, is produced on the antenna substrate 17. In this way, in addition to the mechanically secure connection, a substantially hermetically sealed accommodation of the chip 16 between the chip carrier 15 and the antenna substrate 17 is realized.

Alternatively to the chip carrier 15, a bridging module (not illustrated here in greater detail) can be formed, which serves for connecting an outer contact surface 50 of the antenna 13 illustrated in FIG. 3 with an auxiliary contact surface of the antenna (not illustrated here) in an electrically conductive manner, the auxiliary contact surface being disposed adjacent to the inner contact surface 49 illustrated in FIG. 1, wherein the contact surface 49 and the auxiliary contact surface of the antenna 13 then allow contacting with a chip disposed in the interior region of the antenna 13. To this end, the bridging module needs to be adjusted in relation to the chip carrier 15 illustrated in FIG. 2 to the extent that the contact metallization 19 is formed between the antenna contact surfaces 27, 28 in a continuously electrically conductive manner. This can be realized either by bridging the chip contact arrangement 29 or by forming the contact metallization 19 in a continuous manner. An insulation layer equally continuously formed between the antenna contact surfaces 27, 28 needs to be provided at least in such instances where electrical contacting is likely to occur between an antenna winding and the contact metallization 19. Otherwise, the insulation layer is not necessarily required to be formed so as to cover the entire surface, such that from the chip carrier 15 illustrated in FIG. 2, a bridging module can already be produced by means of an electrically conductive connection of the contact surface brackets 23, 24, respectively the chip contact arrangement 29.

FIG. 4 shows the formation of a plurality of chip carriers 15 on a sheet carrier 34, which in the case at hand is formed as a conveyor sheet having tractive edges 35. Contact metallizations 19 are directly disposed on the sheet carrier 34, and are here disposed in six rows 36, 37, 38, 39, 40 and 41 disposed in parallel to one another and extending in the longitudinal direction of the sheet carrier 34 and in the conveying direction of the sheet carrier 34. The entirety of rows 36 to 41 are covered by an insulation layer 20, with the exception, as described above with reference to FIGS. 2 and 3, of the individual contact metallizations 19 respectively relating to one chip contact arrangement 29 and two antenna contact surfaces 27, 28.

Figure 8:
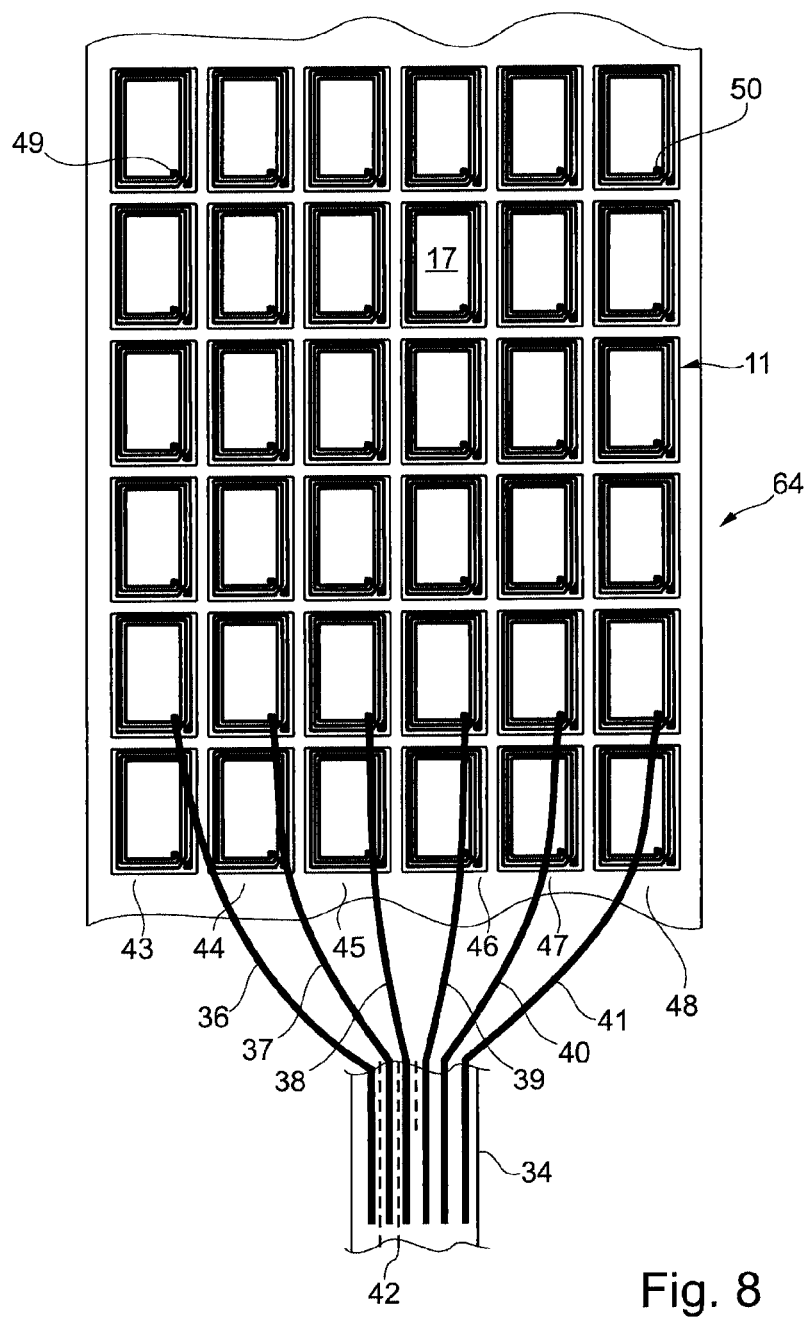
FIG. 8 shows the application of chip modules to antenna modules disposed in a matrix arrangement.

As schematically illustrated by the representation according to FIG. 8, the formation of the chip carriers 15, respectively the arrangement of the contact metallizations 19 in the row illustrated in FIG. 4 on the sheet carrier 34, in interaction with a matrix arrangement 64 of the antenna substrates 17, respectively the antenna modules 11, makes it possible to separate the individual rows 36 to 41 from the sheet carrier 34 by corresponding splitting or slitting actions performed along separating lines 42 and to convey the separated rows 36 to 41 of the chip carriers 15 to the assigned substrate rows 43, 44, 45, 46, 47, and 48 of the antenna modules 11. From the separated rows 36 to 41, the chip carriers 15 can then be separated by means of suitable separation mechanisms and can be contacted with contact surfaces 49, 50 of the individual antennas 13 in order to produce, corresponding to the illustration in FIG. 1, an electrically conductive connection with the antenna module 11 being mechanically resistant due to the adhesive insulation layer 20.

Figure 5:
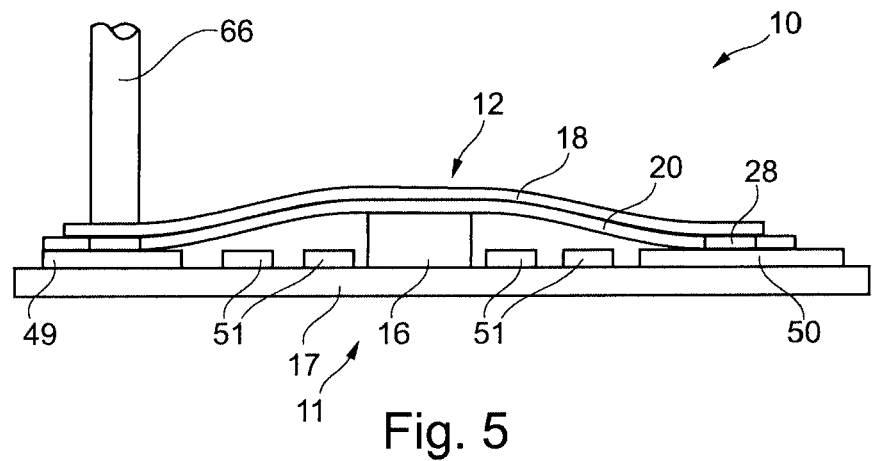
FIG. 5 shows an embodiment of a transponder module in a cross-sectional view according to intersection line V-V in FIG. 1.

FIG. 5 shows the connection between the chip module 12 and the antenna module 11 in an enlarged partial view and along intersection line V-V in FIG. 1. The chip 16 is received in a spacing, which is laterally delimited by windings 51 of the antenna 13 and which is upwardly and downwardly delimited by the carrier substrate 18, respectively the antenna substrate 17. In the contact region with the antenna windings 51, which are disposed between the chip 16 and the contact surfaces 49, 50 of the antenna 13, the adhesive insulation layer 20 rests against the antenna windings 51 at least in sections. It is particularly advantageous if the antenna windings or at least the contact surfaces 49, 50 of the antenna 13, like the antenna contact surfaces 27, 28 of the chip carrier 15, are composed of aluminum, since in this way, a welded connection can be easily produced across the carrier substrate 18 between the antenna contact surfaces 27, 28 and the contact surfaces 50, 51 of the antennas by means of exposure of the antenna contact surfaces 27, 28 to an ultrasonic bonder 65 from behind, as indicated in FIG. 5.

Figure 6:
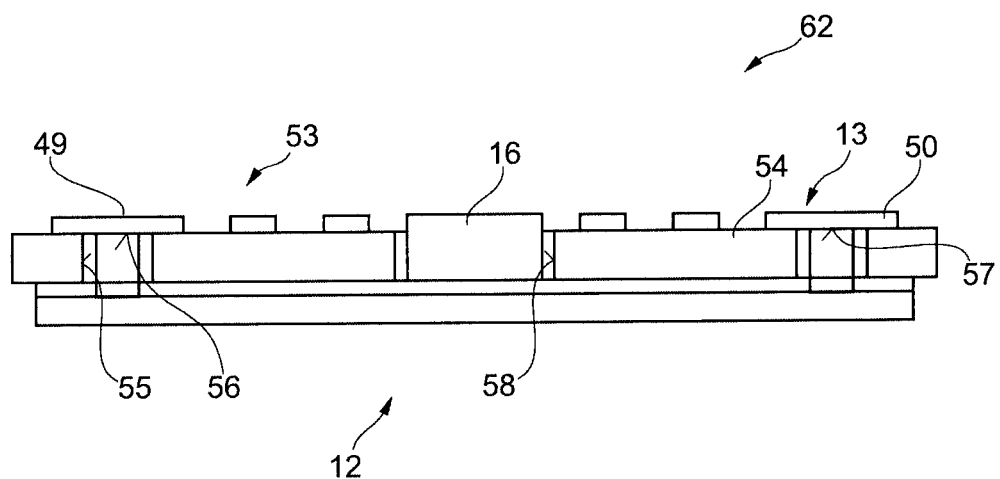
FIG. 6 shows another embodiment of a transponder module in a representation corresponding to FIG. 5.

FIG. 6 shows a transponder module 67 with a different arrangement of the chip module 12 on a transponder module 53, the antenna substrate 54 thereof, in contrast to the antenna substrate 17 of the transponder module 10 illustrated in FIG. 5, being furnished with contact recesses 55 which enable contacting of the contact surfaces 49, 50 of the antenna 13 from the contact surface back sides 56, 57. As is evident from FIG. 6, in the antenna substrate 54 provision is also made for a chip recess 58 which enables arrangement of the chip 16 within the chip recess 58 and thus enables an overall very flat and thin configuration of a transponder module 58 formed from the antenna module 53 and the chip module 12.

Figure 7:
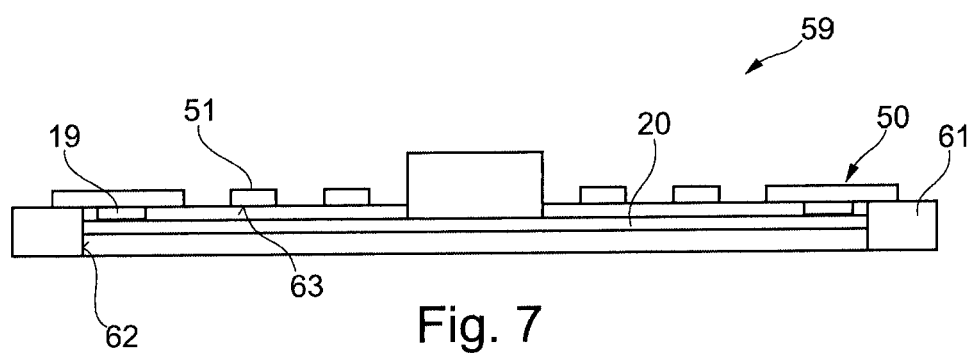
FIG. 7 shows another embodiment of a transponder module in a representation corresponding to FIG. 5.

FIG. 7 shows a transponder module 59 comprising an antenna module 60, the antenna substrate 61 thereof having a chip module recess 62 that enables an overall adhesive arrangement of the insulation layer 20 against winding back sides 63 of the antenna windings 49. By means of this measure, the insulation layer 20 and the contact metallization 19 being at least partially covered by the insulation layer 20 are substantially arranged in one plane with the antenna substrate 17.

The invention claimed is:

1. A transponder module comprising a chip module disposed on an antenna module, with a chip and chip carrier featuring a strip-shaped carrier substrate, the chip being electrically contacted with a chip contact arrangement which is located at a distance from longitudinal ends of the carrier substrate for electrically contacting the chip and is disposed between antenna contact surfaces, such that terminal faces of the chip are directly connected to the chip contact arrangement in an electrically conductive manner, wherein the chip contact arrangement and the antenna contact surfaces are located on an application surface of the carrier substrate and at least one insulation surface is formed on the application surface between the chip contact arrangement and the antenna contact surfaces, the antenna module including an antenna disposed on an antenna side of an antenna substrate, the contact surfaces of the antenna at least partially extending over contact recesses formed in the antenna substrate, wherein the chip module is disposed on an opposite side facing the antenna side, such that the antenna contact surfaces of the chip module are contacted with contact surface back sides of the contact surfaces in an electrically conductive manner and the chip engages with a chip recess formed in the antenna substrate.

2. The transponder module according to claim 1 in which the chip recess and the contact recesses are formed as a chip module recess being coherently formed in the antenna substrate.

3. The transponder module according to claim in which the antenna substrate and the carrier substrate are composed of a polyolefin.

4. The transponder module according to claim 3, in which the antenna substrate and the module substrate are composed of the same material, in particular PET.

5. A transponder module comprising:
an antenna module including an antenna disposed on an antenna side of an antenna substrate, antenna contact surfaces of the antenna at least partially extending over contact recesses formed in the antenna substrate
a chip module disposed on the antenna module, the chip module including a chip and a carrier substrate, the chip being electrically contacted with a chip contact arrangement located at a distance from longitudinal ends of the carrier substrate for electrically contacting the chip, the chip being disposed between the antenna contact surfaces, such that terminal faces of the chip are directly connected to the chip contact arrangement in an electrically conductive manner, wherein the chip contact arrangement and the antenna contact surfaces are located on an application surface of the carrier substrate and at least one insulation surface is formed on the application surface between the chip contact arrangement and the antenna contact surfaces, wherein the chip module is disposed on a side of the antenna substrate opposite the antenna side of the antenna substrate, such that the antenna contact surfaces of the chip module are contacted with contact surface back sides of the contact surfaces in an electrically conductive manner and the chip engages with a chip recess formed in the antenna substrate.

* * * * *